United States Patent
Wang et al.

(10) Patent No.: US 11,855,153 B2
(45) Date of Patent: Dec. 26, 2023

(54) SEMICONDUCTOR DEVICE AND METHOD

(71) Applicant: Taiwan Semiconductor Manufacturing Co., Ltd., Hsinchu (TW)

(72) Inventors: Po-Chuan Wang, Taipei (TW); Chia-Yang Hung, Kaohsiung (TW); Sheng-Liang Pan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 142 days.

(21) Appl. No.: 17/245,766

(22) Filed: Apr. 30, 2021

(65) Prior Publication Data

US 2022/0293741 A1 Sep. 15, 2022

Related U.S. Application Data

(60) Provisional application No. 63/158,996, filed on Mar. 10, 2021.

(51) Int. Cl.
| | |
|---|---|
| *H01L 29/40* | (2006.01) |
| *H01L 21/768* | (2006.01) |
| *H01L 21/311* | (2006.01) |
| *H01L 23/532* | (2006.01) |
| *H01L 23/522* | (2006.01) |
| *H01L 29/45* | (2006.01) |
| *H01L 21/3215* | (2006.01) |
| *H01L 29/417* | (2006.01) |

(52) U.S. Cl.
CPC ...... *H01L 29/401* (2013.01); *H01L 21/31122* (2013.01); *H01L 21/76805* (2013.01); *H01L 21/76859* (2013.01); *H01L 21/76877* (2013.01); *H01L 21/3215* (2013.01); *H01L 21/76831* (2013.01); *H01L 21/76844* (2013.01); *H01L 23/5226* (2013.01); *H01L 23/53257* (2013.01); *H01L 29/41791* (2013.01); *H01L 29/456* (2013.01)

(58) Field of Classification Search
CPC .................. H01L 21/76805; H01L 21/76877
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |

(Continued)

FOREIGN PATENT DOCUMENTS

| | | |
|---|---|---|
| CN | 104183609 A | 12/2014 |
| DE | 102019112728 A1 | 10/2020 |

(Continued)

*Primary Examiner* — Farun Lu
(74) *Attorney, Agent, or Firm* — Slater Matsil, LLP

(57) ABSTRACT

A semiconductor device and method of manufacture are provided which utilize a remote plasma process which reduces or eliminates segregation of material. By reducing segregation of the material, overlying conductive material can be deposited on a smoother interface. By depositing on smoother interfaces, overall losses of the deposited material may be avoided, which improves the overall yield.

20 Claims, 15 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2014/0011339 A1 | 1/2014 | Zheng et al. |
| 2019/0157148 A1* | 5/2019 | Hsieh .............. H01L 21/823821 |
| 2019/0259855 A1 | 8/2019 | Cheng et al. |
| 2019/0287851 A1* | 9/2019 | Chen ................. H01L 21/76814 |
| 2019/0294050 A1 | 9/2019 | Topping et al. |
| 2019/0305107 A1 | 10/2019 | Chen et al. |
| 2020/0312971 A1 | 10/2020 | Penumatcha et al. |
| 2020/0343135 A1 | 10/2020 | Huang et al. |
| 2021/0371972 A1* | 12/2021 | Xie ....................... C23C 16/466 |
| 2022/0254660 A1* | 8/2022 | Huang .............. H01J 37/32458 |

FOREIGN PATENT DOCUMENTS

| | | |
|---|---|---|
| TW | 375808 B | 12/1999 |
| TW | 202036918 A | 10/2020 |

\* cited by examiner

SEMICONDUCTOR DEVICE AND METHOD

PRIORITY CLAIM AND CROSS-REFERENCE

This application claims the benefit of U.S. Provisional Application No. 63/158,996, filed on Mar. 10, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
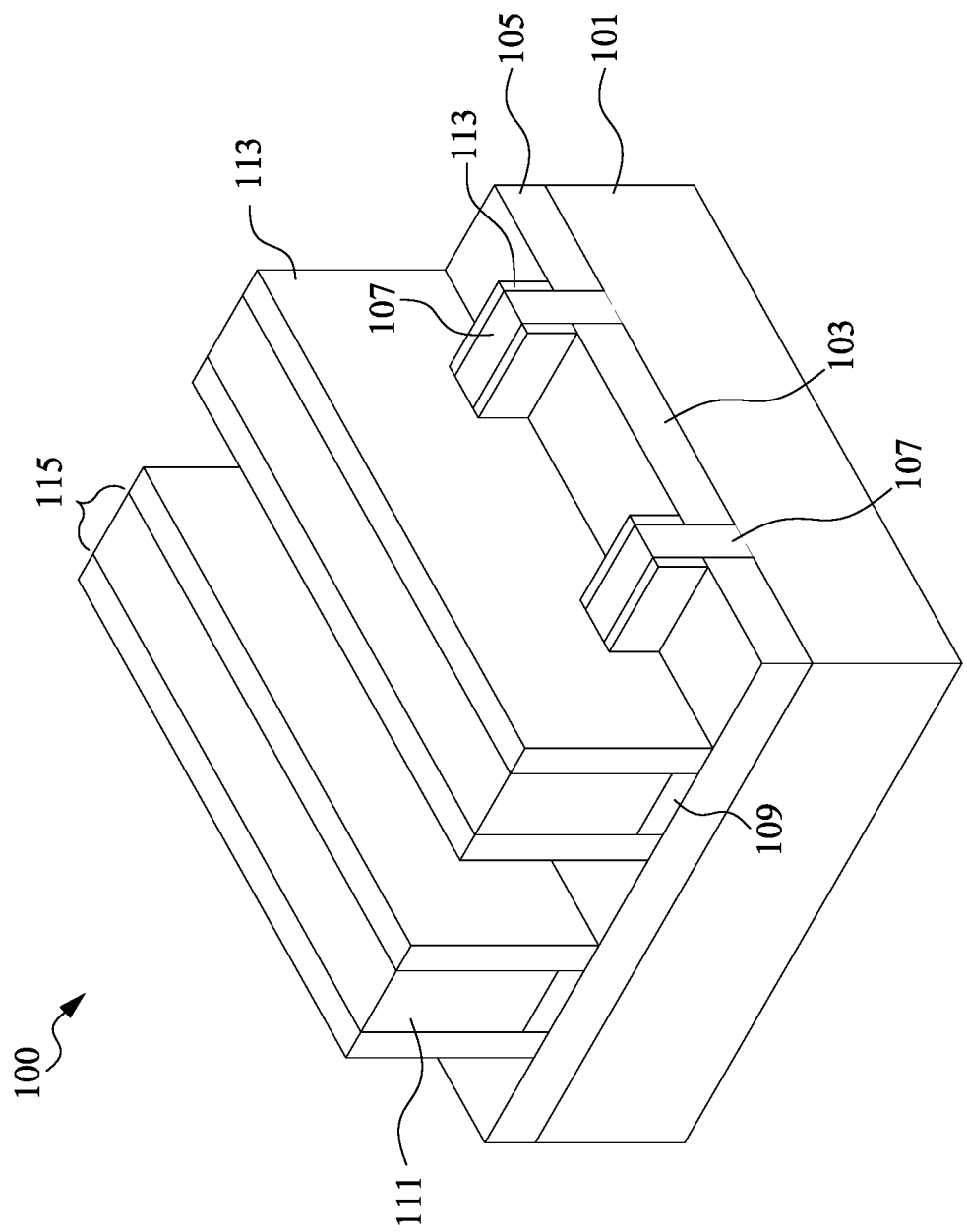
FIG. 1 illustrates a gate structure over a semiconductor fin, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which utilize a non-segregating process to prepare a source/drain contact for further connections in a 5 nm process node, a 3 nm process node, and beyond. The embodiments described, however, are intended to be illustrative and are not intended to be limiting, as the ideas presented herein may be applied in a wide variety of embodiments.

With reference now to FIG. 1, there is illustrated a perspective view of a semiconductor device 100 such as a fin field effect transistor (finFET) device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates two fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å, such as about 50 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
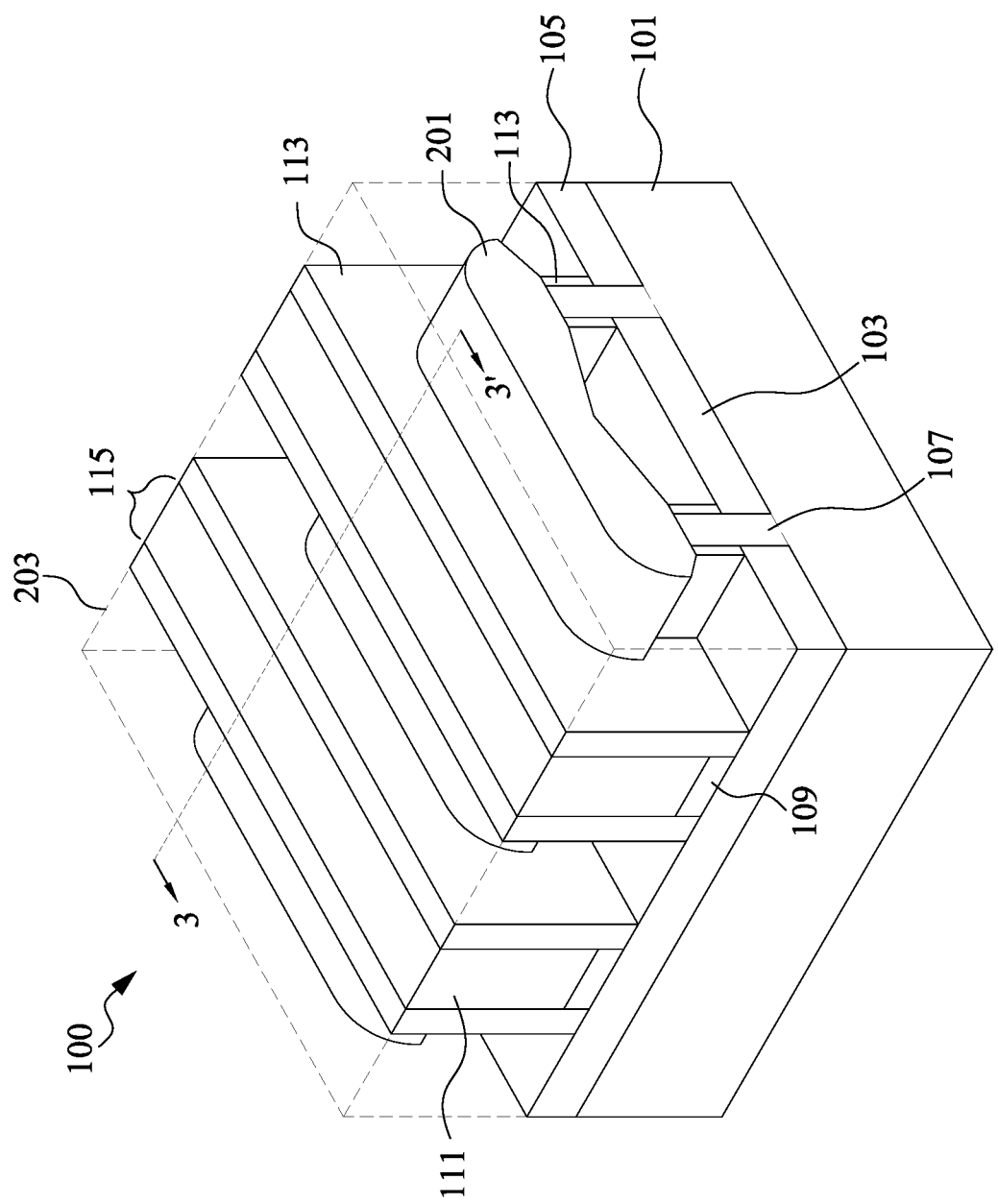
FIG. 2 illustrates a finFET device, in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks. However, any suitable process may be utilized.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å, and may have a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. In another embodiment, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that cover the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

Once the hard mask has been removed, a first etch stop layer 204 (not separately illustrated in FIG. 2 for clarity but illustrated and seen in FIG. 3 below) may be deposited. In an embodiment the first etch stop layer 204 may be formed of silicon oxide or silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and other techniques of forming the first etch stop layer 204, such as low pressure CVD (LPCVD), PVD, or the like, could also be used. The first etch stop layer 204 may have a thickness of between about 5 Å and about 500 Å.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
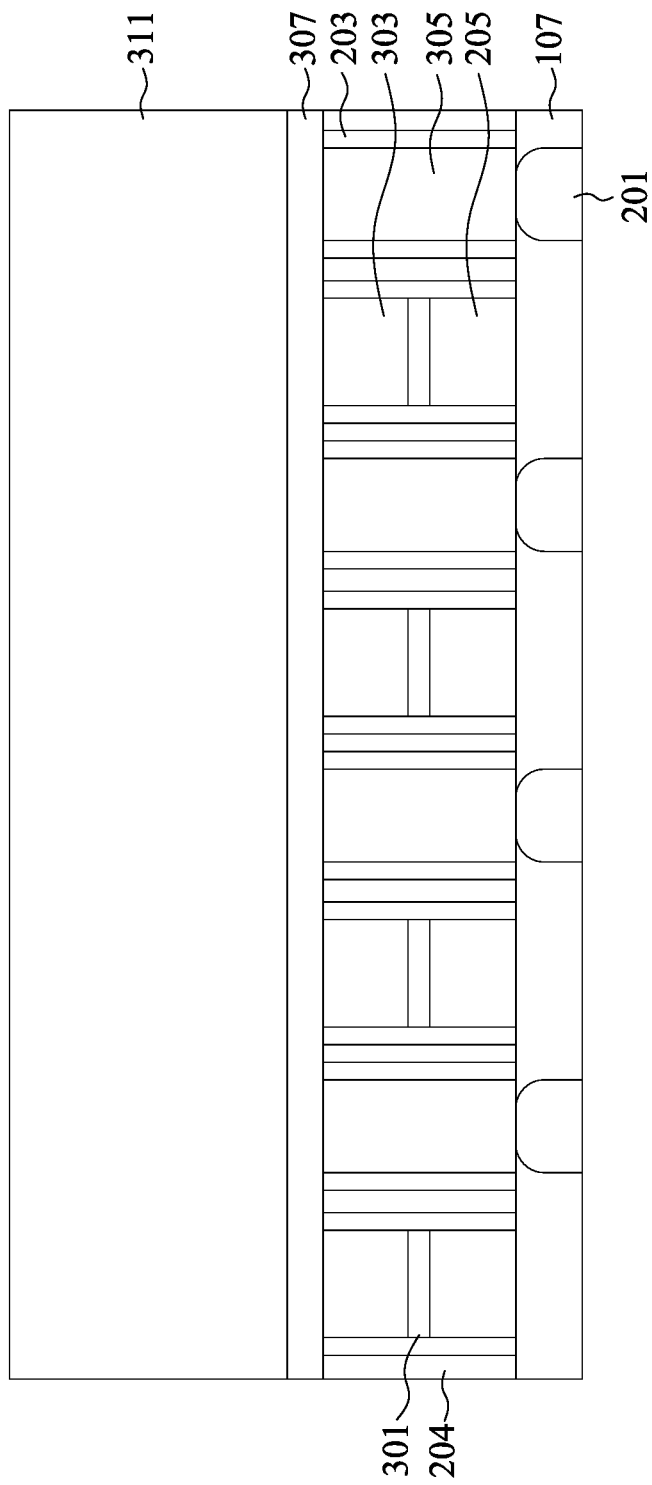
FIG. 3 illustrates formation of interlayer dielectric, in accordance with some embodiments.

FIG. 3 illustrates a cross sectional view of the structure of FIG. 2 along line 3-3' while also showing additional structures not illustrated in FIG. 2, and also illustrates that, after the formation of the ILD layer 203, the material of the dummy gate electrode 111 and the dummy gate dielectric 109 may be removed and replaced to form a gate stack 205. In an embodiment the dummy gate electrode 111 and, if desired, the dummy gate dielectric 109 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form a gate stack 205. In a particular embodiment the gate stack 205 comprises a first dielectric material, a first metal material, a second metal material, and a third metal material. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode 111. In an embodiment the third metal material is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

Optionally, after the materials of the gate stack 205 have been formed and planarized, the materials of the gate stack 205 may be recessed and capped with a conductive capping layer 301 and a dielectric capping layer 303. In an embodiment the materials of the gate stack 205 may be recessed using, e.g., a wet or dry etching process that utilizes etchants selective to the materials of the gate stack 205. In an embodiment the materials of the gate stack 205 may be recessed a distance of between about 5 nm and about 150 nm, such as about 120 nm. However, any suitable process and distance may be utilized.

Once the materials of the gate stack 205 have been recessed, the conductive capping layer 301 may be deposited within the recess on the materials of the gate stack 205 using a selective deposition process. In some embodiments, the selective deposition is a fluorine-free tungsten deposition, and hence, the conductive capping layer 301 can be free of fluorine. In some embodiments, the selective deposition process, which further is a fluorine-free tungsten deposition, is an ALD process that uses a hydrogen ($H_2$) precursor and a tungsten chloride precursor. In other embodiments, the selective deposition process is a CVD process such as an MOCVD process using a tungsten chloride precursor. The tungsten chloride precursor can be tungsten pentachloride, tungsten hexachloride, another tungsten chloride, or a combination thereof. In some embodiments, the conductive capping layer 301 is formed to a height in a range of 2.5 nm to 3.3 nm. However, any suitable dimensions may be utilized.

The dielectric capping layer 303 may be deposited and planarized with the first spacers 113. In an embodiment the dielectric capping layer 303 is a material such as SiN, SiON, SiCON, SiC, SiOC, combinations of these, or the like, deposited using a deposition process such as atomic layer deposition, chemical vapor deposition, sputtering, or the like. The dielectric capping layer 303 may be deposited to a thickness of between about 5 Å and about 200 Å, and then planarized using a planarization process such as chemical mechanical polishing such that the dielectric capping layer 303 is planar with the first spacers 113.

Once the dielectric capping layer 303 has been planarized, contacts 305 are formed through the ILD layer 203 and the first etch stop layer 204 to make physical and electrical contact with the source/drain regions 201. In an embodiment the contacts 305 may be formed by initially forming source/drain contact openings through the ILD layer 203 and the first etch stop layer 204. In an embodiment the source/drain contact openings can be formed using one or more etching processes to sequentially etch through the ILD layer 203 and the first etch stop layer 204. However, any suitable process or processes may be used to form the source/drain contact openings and expose the source/drain regions 201.

Once the source/drain regions 201 have been exposed, an optional silicide contact (not separately illustrated) may be formed on the source/drain regions 201. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

Once the silicide contacts have been formed, the contacts 305 are formed. In an embodiment the contacts 305 may be a conductive material such as Co, W, Al, Cu, Ti, Ta, Ru, TiN, TiAl, TiAlN, TaN, TaC, NiSi, CoSi, combinations of these, or the like, although any suitable material may be deposited using a deposition process such as sputtering, chemical vapor deposition, electroplating, electroless plating, or the like, to fill and/or overfill the opening. Once filled or overfilled, any deposited material outside of the opening may be removed using a planarization process such as chemical mechanical polishing (CMP). However, any suitable material and process of formation may be utilized.

FIG. 3 continues by illustrating a formation of a second etch stop layer 307 over the gate stacks 205. In an embodiment the second etch stop layer 307 may be formed of a silicon nitride or silicon oxide using plasma enhanced chemical vapor deposition (PECVD), although other materials such as SiON, SiCON, SiC, SiOC, $SiC_xN_y$, $SiO_x$, other dielectrics, combinations thereof, or the like, and other techniques of forming the second etch stop layer 307, such as low pressure CVD (LPCVD), PVD, or the like, could be used. The second etch stop layer 307 may have a thickness of between about 5 Å and about 500 Å.

FIG. 3 additionally illustrates a formation of a second ILD layer 311. The second ILD layer 311 may comprise an oxide material such as $SiO_x$, SiON, SiCON, SiC, SiOC, $SiC_xN_y$, although any other suitable materials, such as boron phosphorous silicate glass (BPSG) or any other low-k dielectric layers, may be used. The second ILD layer 311 may be formed using a process such as PECVD, although other processes, such as LPCVD, may also be used. The second ILD layer 311 may be formed to a thickness of between about 70 Å and about 3,000 Å, such as 700 Å. Once formed, the second ILD layer 311 may be planarized using, e.g., a planarization process such as a chemical mechanical polishing process, although any suitable process may be utilized.

Figure 4:
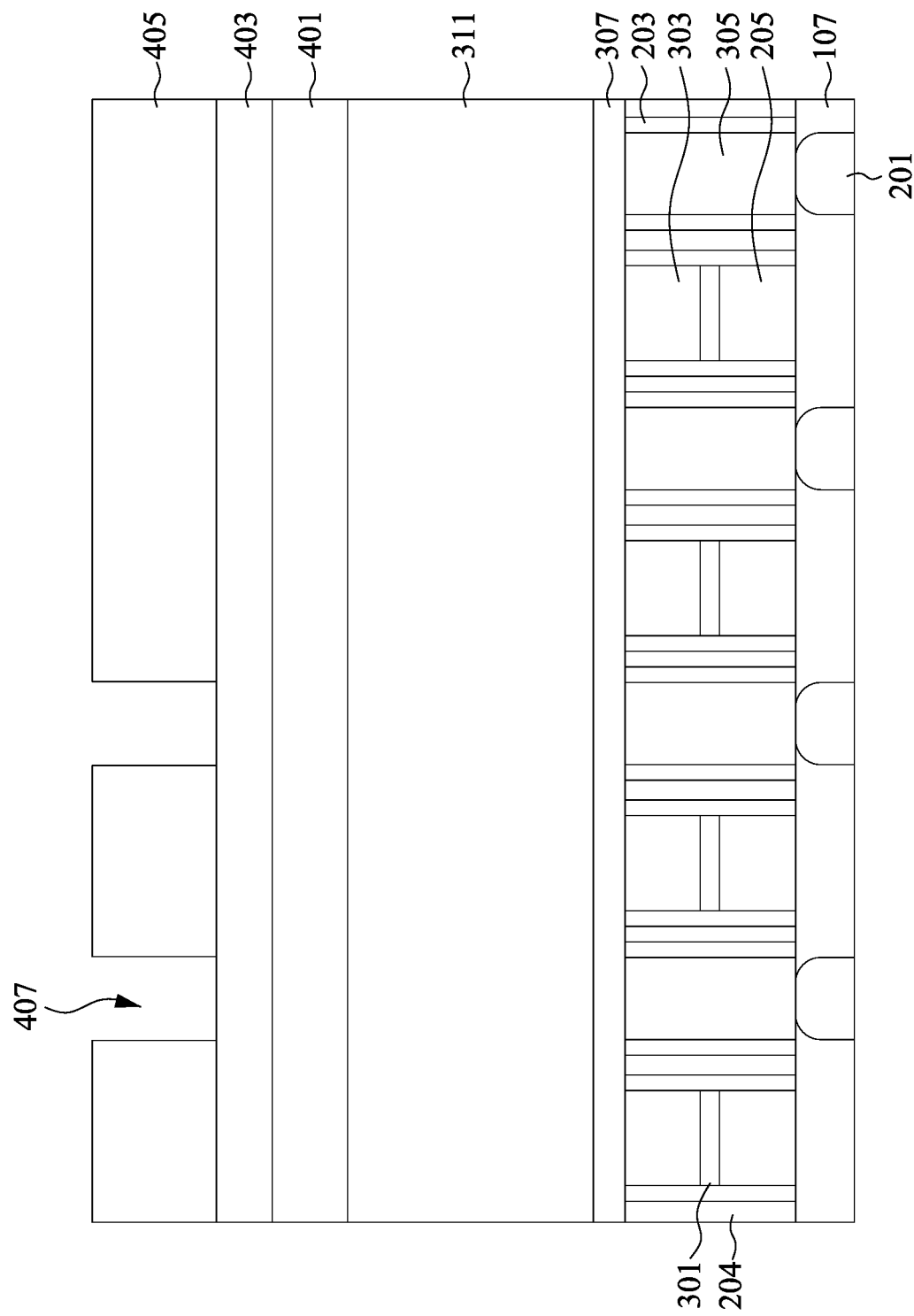
FIG. 4 illustrates placement and patterning of a photoresist, in accordance with some embodiments.

FIG. 4 illustrates a formation of a photoresist over the second ILD layer 311 in preparation for forming openings to the source/drain regions 201. In an embodiment the photoresist may comprise a bottom anti-reflective coating (BARC) layer 401, an intermediate mask layer 403, and a first top photosensitive layer 405. The BARC layer 401 is applied in preparation for an application of the first top photosensitive layer 405. The BARC layer 401, as its name suggests, works to prevent the uncontrolled and undesired reflection of energy (e.g., light) back into the overlying first top photosensitive layer 405 during an exposure of the first top photosensitive layer 405, thereby preventing the reflecting light from causing reactions in an undesired region of the first top photosensitive layer 405. Additionally, the BARC layer 401 may be used to provide a planar surface, helping to reduce the negative effects of the energy impinging at an angle.

The intermediate mask layer 403 may be placed over the BARC layer 401. In an embodiment the intermediate mask layer 403 is a hard mask material such as silicon nitride, oxides, oxynitrides, silicon carbide, combinations of these, or the like. The hard mask material for the intermediate mask layer 403 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may be utilized. Any suitable method or combination of methods to form or otherwise place the hardmask material may be utilized, and all such methods or combination are fully intended to be included within the scope of the embodiments. The intermediate mask layer 403 may be formed to a thickness of between about 100 Å and about 800 Å, such as about 300 Å.

In an embodiment the first top photosensitive layer 405 is applied over the intermediate mask layer 403 using, e.g., a spin-on process, and includes a photoresist polymer resin along with one or more photoactive compounds (PACs) in a photoresist solvent. Once each of the BARC layer 401, the intermediate mask layer 403, and the first top photosensitive layer 405 have been applied, the first top photosensitive layer 405 is exposed to a patterned energy source (e.g., light). The PACs will absorb the patterned light source and generate a reactant in those portions of the first top photosensitive layer 405 that are exposed, thereby causing a subsequent reaction with the photoresist polymer resin that can be developed in order to replicate the patterned energy source within the first top photosensitive layer 405. Once the reaction has occurred, the first top photosensitive layer 405 is developed in order to create first openings 407 within the first top photosensitive layer 405.

Figure 5:
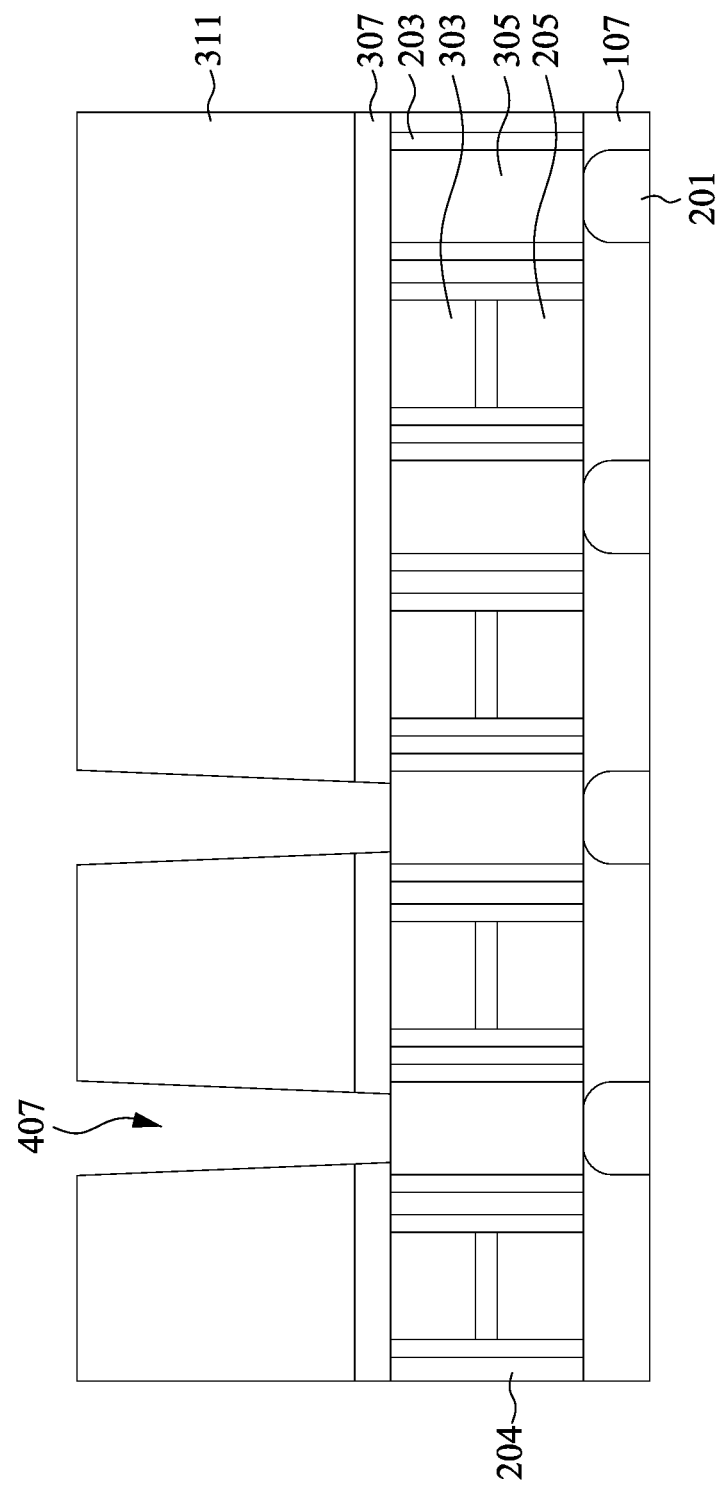
FIG. 5 illustrates a patterning of the interlayer dielectric, in accordance with some embodiments.

FIG. 5 illustrates that, once the first openings 407 have been formed within the first top photosensitive layer 405, the first top photosensitive layer 405 may then be used as a mask to extend the pattern into the intermediate mask layer 403 and the BARC layer 401 using one or more etching processes. Similarly, once the intermediate mask layer 403 and the BARC layer 401 have been patterned, the intermediate mask layer 403 and the BARC layer 401 may be utilized as masks to extend the first openings 407 through the ILD layer 203 and the second etch stop layer 307 to expose the contacts 305.

In a particular embodiment, the extension may be performed using a series of dry etches with different etchants, diluents, combinations thereof, or the like. For example, an etching process using a combination of methane and nitrogen followed by an etching process utilizing nitrogen may be used, and then an etching process using a combination of $CF_4$, nitrogen, argon, and hydrogen may be used to etch through the intermediate mask layer 403. The pattern may then be extended through the BARC layer 401 using a first etch with nitrogen and hydrogen followed by an etch using a combination of carbonyl sulfide (COS), oxygen and nitrogen.

Once the BARC layer 401 has been etched, an etch utilizing $CF_4$, $CHF_3$, nitrogen and argon followed by an etch using $C_4F_6$, oxygen and argon may be used to etch through the ILD layer 203. Once the first ILD layer 203 has been etched, an oxygen strip may be used to remove the first top photosensitive layer 405. Then, a series of liner removal etches utilizing $CH_3F$ and hydrogen may be utilized in order to extend the pattern through the second etch stop layer 307. Finally, a last etch utilizing nitrogen and hydrogen may be used.

However, while a very particular set of etches has been described above, this description is intended to be illustrative and is not intended to be limiting. Rather, any suitable etch or combination of etches may be used to extend the first opening 407 through the various layers in order to expose the contacts 305. All such etches or combination of etches are fully intended to be included within the scope of the embodiments.

Figure 6:
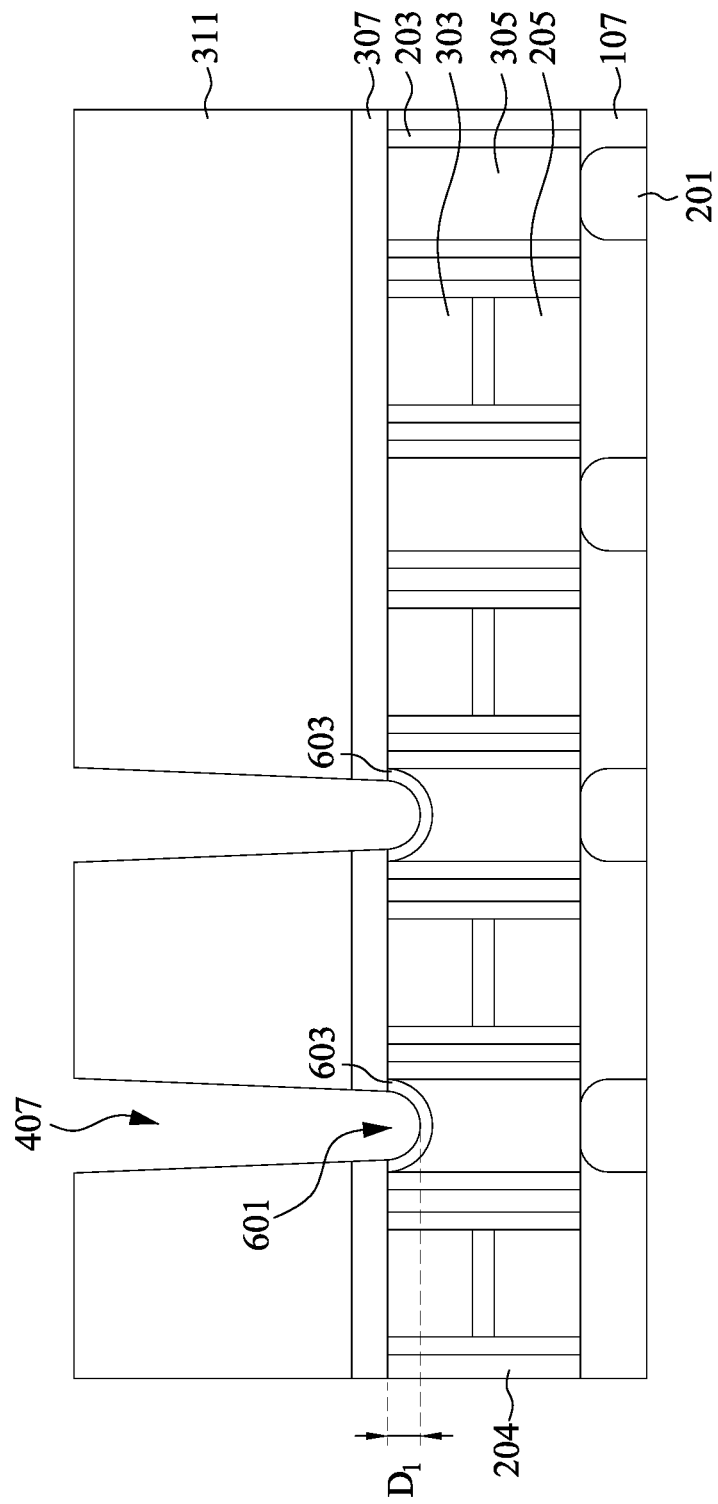
FIG. 6 illustrates a recessing of a source/drain contact, in accordance with some embodiments.

FIG. 6 illustrates formation of a recess 601 within the contact 305. In an embodiment the recess 601 may be formed by removing material of the contact 305 (e.g., cobalt) using an etching process such as a wet etch or a dry etch using etchants that are selective to the material of the contact 305. Additionally, the recess 601 may be formed to extend into the contact 305 a first distance $D_1$ of between about 5 nm and about 10 nm. However, any suitable distance and any suitable method of recessing the material may be utilized.

FIG. 6 also illustrates that, once the recess 601 has been formed, a treatment may be performed on the exposed surface of the contact 305 in order to help prevent selective growth of subsequently deposited material along the sidewalls of the first openings 407. In an embodiment the treatment may be an oxidation treatment which treats the sidewalls but which will also react with the exposed material of the contact 305 to form a base layer 603 such as an oxide base layer along the exposed surfaces of the recesses 601. In an embodiment the base layer 603 may be formed as a native oxide material, whereby the exposed material of the contact 305 is oxidized either intentionally or through an exposure to an oxygen containing ambient atmosphere to form the oxide material. In an embodiment in which the exposed material is intentionally oxidized, the oxidation can occur through a process such as an ion bombardment with oxygen followed by an ashing process in an ambient air environment. As such, the base layer 603 is formed adjacent to the contact 305 along a bottom of the recess 601 and may have a thickness of about 6 nm.

However, while multiple oxidation processes for forming the base layer 603 within the recess 601 have been described, these are intended to be illustrative and are not intended to be limiting. Rather, any suitable method of forming the base layer 603 may be utilized. All such methods are fully intended to be included within the scope of the embodiments.

Figure 7A:
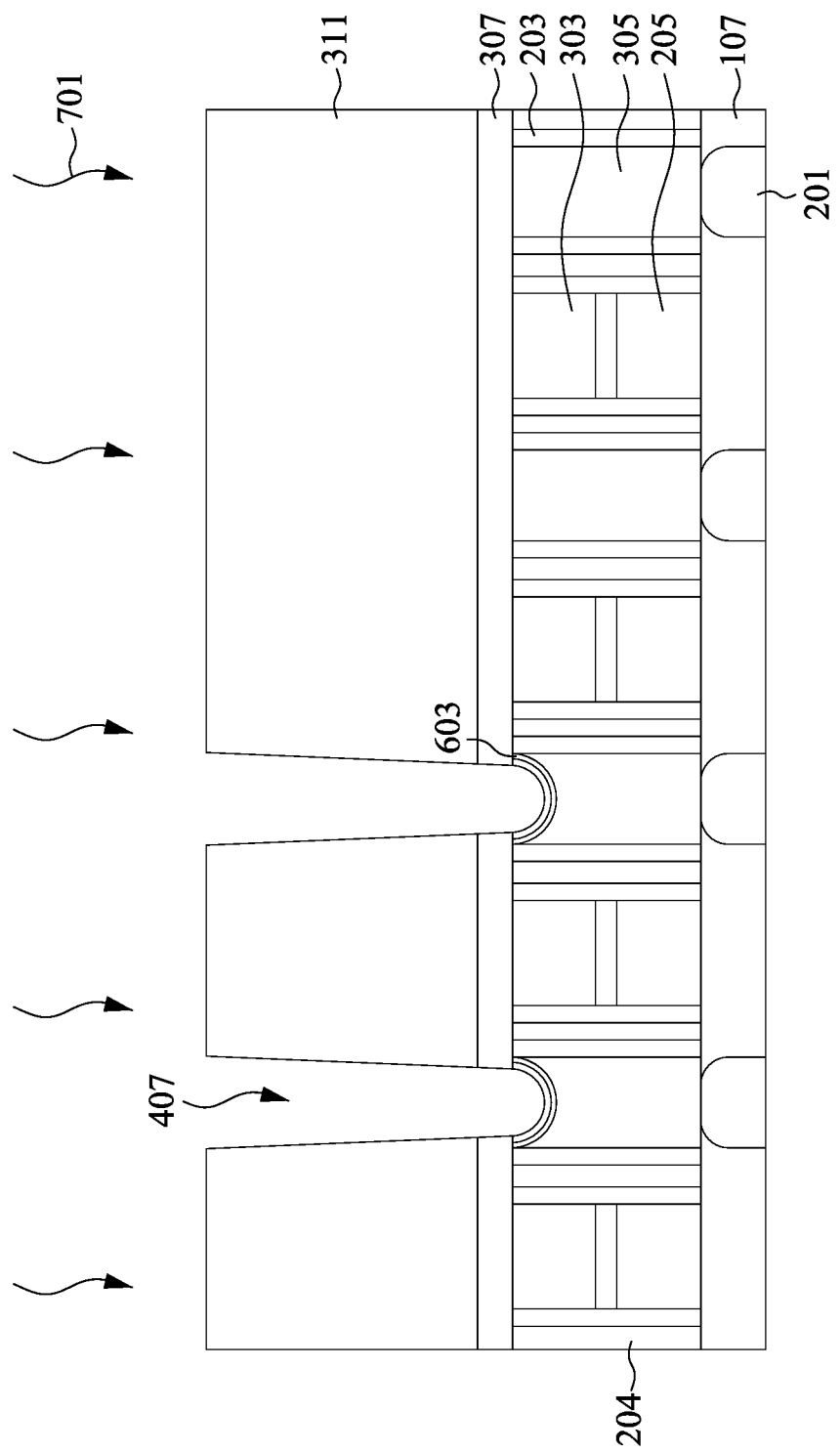
FIGS. 7A-7E illustrate treatment processes, in accordance with some embodiments.
Figure 7B:
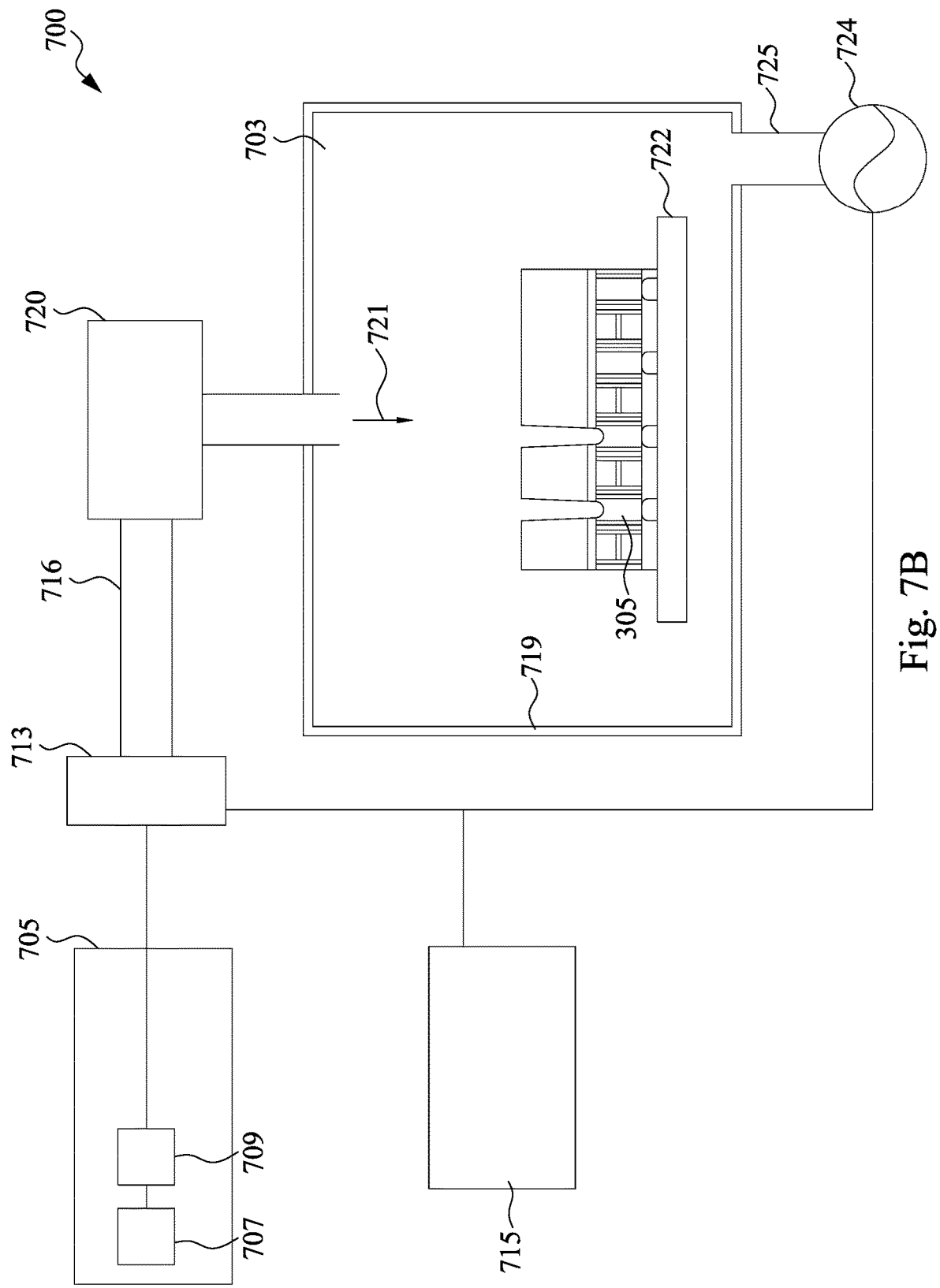

FIGS. 7A-7E illustrate a treatment process (represented in FIG. 7A by the wavy lines labeled 701) which may be used in order to partially or completely remove the base layer 603 without material segregation and prepare the contact 305 to receive an overlying conductive contact 801 (not illustrated in FIGS. 7A-7E but illustrated and discussed further below with respect to FIG. 8). FIG. 7B illustrates that, to initiate the treatment process 701, the contact 305 with the base layer 603 (along with the remaining structure) may be placed within a first treatment system 700 that may, for example, use a remote plasma system as part of the treatment process 701.

In an embodiment the first treatment system 700 may receive a first treatment precursor from a first precursor delivery system 705 which works to supply the desired precursor material to the treatment chamber 703 through, e.g., a precursor gas controller 713. In an embodiment, the first precursor delivery system 705 may include a gas supply 707 and a flow controller 709, wherein the gas supply 707 may be a vessel, such as a gas storage tank, that is located either locally to the treatment chamber 703 or else may be located remotely from the treatment chamber 703. In another embodiment, the gas supply 707 may be a facility that independently prepares and delivers the first treatment precursor to the flow controller 709. Any suitable source for the first treatment precursor may be utilized as the gas supply 707, and all such sources are fully intended to be included within the scope of the embodiments.

Additionally, in an embodiment in which the first treatment precursor is stored in a solid or liquid state, the gas supply 707 may store a carrier gas and the carrier gas may be introduced into a precursor canister (not separately illustrated), which stores the first treatment precursor in the solid or liquid state. The carrier gas is then used to push and carry the first treatment precursor as it either evaporates or sublimates into a gaseous section of the precursor canister before being sent to the precursor gas controller 713. Any suitable method and combination of units may be utilized to provide the first treatment precursor, and all such combination of units are fully intended to be included within the scope of the embodiments.

The gas supply 707 may supply the desired first treatment precursor to the flow controller 709. The flow controller 709 may be utilized to control the flow of the first treatment precursor to the precursor gas controller 713 and, eventually, to the treatment chamber 703, thereby also helping to control the pressure within the treatment chamber 703. The flow controller 709 may be, e.g., a proportional valve, a modulating valve, a needle valve, a pressure regulator, a mass flow controller, combinations of these, or the like. However, any suitable method for controlling and regulating the flow of the first treatment precursor to the precursor gas controller 713 may be utilized, and all such components and methods are fully intended to be included within the scope of the embodiments.

However, as one of ordinary skill in the art will recognize, while the first precursor delivery system 705 has been described herein as having particular components, this is merely an illustrative example and is not intended to limit the embodiments in any fashion. Any type of suitable precursor delivery system, with any type and number of individual components, may be utilized. All such precursor delivery systems are fully intended to be included within the scope of the embodiments.

The first precursor delivery system 705 may supply its precursor materials into the precursor gas controller 713 which may connect and isolate the first precursor delivery system 705 to and from the treatment chamber 703 in order to deliver the desired precursor material to the treatment chamber 703 at a desired rate. The precursor gas controller 713 may include such devices as valves, flow meters, sensors, and the like to control the delivery rate of the first treatment precursor, and may be controlled by instructions received from the control unit 715. The precursor gas controller 713, upon receiving instructions from the control unit 715, may open and close valves so as to connect the first precursor delivery system 705 to the treatment chamber 703 and direct the desired treatment through a manifold 716 to a plasma block 720.

Figure 7C:
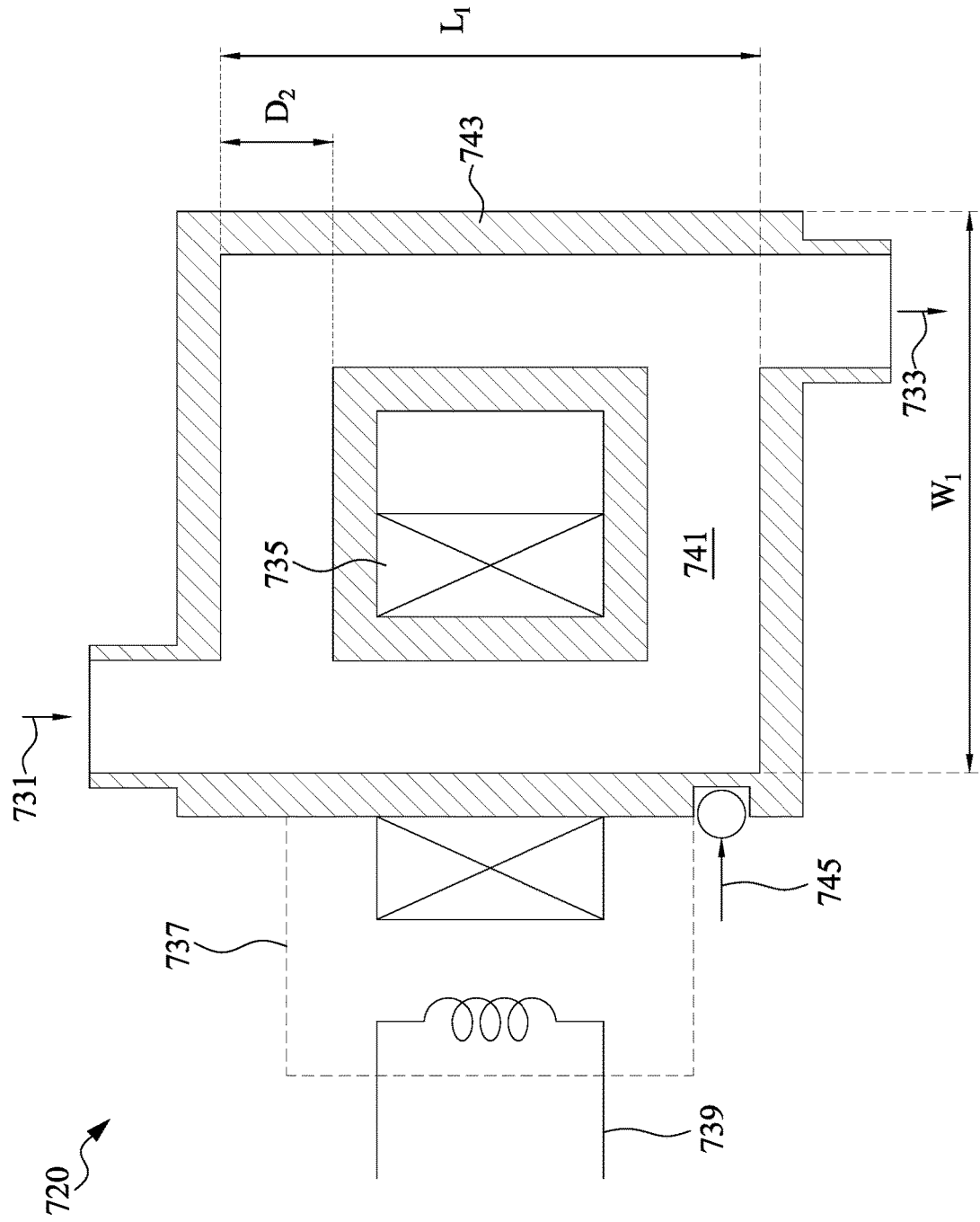

FIG. 7C illustrates an embodiment of the plasma block 720 (or plasma generator) from FIG. 7B in greater detail. In an embodiment the plasma block 720 has an inlet port 731 that receives the first treatment precursor from the precursor gas controller 713 and an outlet port 733 that is coupled to deliver a first treatment plasma 721 (converted from the first treatment precursor and not illustrated in FIG. 7C but seen in FIG. 7B) to the treatment chamber 703. The first treatment precursor enters the plasma block 720 and passes between a magnetic core 735 that surrounds a portion of the plasma block 720. The magnetic core 735 is utilized to induce the formation of the first treatment plasma 721 from the first treatment precursor that enters the plasma block 720 before exiting out of the outlet port 733.

The magnetic core 735 may be situated around a portion of the flow path through the plasma block 720 from the inlet port 731 to the outlet port 733. In an embodiment the magnetic core 735 is one portion of a transformer 737 (illustrated in FIG. 7C with dashed line 737), with a primary coil 739 forming another portion of the transformer 737. In an embodiment the primary coil 739 may have a winding of between about 100 and about 1000 such as about 600.

To generate the desired first treatment plasma 721 from the first treatment precursor within the plasma block 720, a short, high-voltage pulse of electricity controlled, e.g., by the control unit 715 (see FIG. 7B) may be applied to the primary coil 739. The high-voltage pulse of electricity in the primary coil 739 is transformed to a pulse of energy into the magnetic core 735, which induces the formation of the first treatment plasma 721 within the plasma block 720. In an embodiment the high-voltage pulse may be between about 10 kHz and about 30 MHz such as about 13.56 MHz, while the temperature is between about 50° C. and about 200° C. and with a pressure of between about 1 torr and about 20 torr.

However, while igniting the first treatment precursor with a magnetic coil is described as an embodiment that may be used with the embodiments, the embodiments are not so limited. Rather, any suitable method or structures may be used to ignite the first treatment precursor to form the first treatment plasma 721. For example, in other embodiments a high voltage pulse may be applied to an electrode (not illustrated) coupled to the plasma block 720, or the first treatment precursor may be exposed to a ultraviolet radiation that may be used to ignite the first treatment precursor and form the first treatment plasma 721. Any suitable method of igniting the first treatment precursor and any other suitable plasma inducing device are fully intended to be included within the scope of the embodiments.

The plasma block 720 comprises a circular path between the inlet port 731 and the outlet port 733 in which the first treatment precursor may travel. In an embodiment the circular path may have a first length $L_1$ of between about 100 mm and about 500 mm, such as about 250 mm, and a first width $W_1$ of between about 100 mm and about 500 mm such as about 250 mm. Similarly, the interior of the circular path through the plasma block may have a second distance $D_2$ of between about 20 mm and about 150 mm, such as about 70 mm. However, any other suitable structure or shape may be utilized.

The plasma block 720 also comprises an inner housing 741 and an insulator 743 surrounding the inner housing 741. The insulator 743 may be used to electrically and thermally isolate the inner housing 741 of the plasma block 720. In an embodiment the inner housing 741 encloses and encapsulates the circular path of the first treatment precursor and (after ignition) the first treatment plasma 721 in order to guide the first treatment precursor and the first treatment plasma 721 through the plasma block 720.

The plasma block 720 may also comprise a sensor 745 that may be used to measure the conditions within the plasma block 720. In an embodiment the sensor 745 may be a current probe used to measure the current and power of the plasma as part of a feedback loop to the control unit 715 (see FIG. 7B). In addition, the sensor 745 may also comprise an optical sensor or any other measurement devices that may be used to measure and control the plasma generation within the plasma block 720.

Returning now to FIG. 7B, once the first treatment plasma 721 has been generated, the first treatment plasma 721 may be directed into the treatment chamber 703. The treatment chamber 703 may receive the first treatment plasma 721 and expose the first treatment plasma 721 to the contact 305, and the treatment chamber 703 may be any desired shape that may be suitable for dispersing the first treatment plasma 721 and contacting the first treatment plasma 721 with the contact 305. In the embodiment illustrated in FIG. 7B, the treatment chamber 703 has a cylindrical sidewall and a bottom. However, the treatment chamber 703 is not limited to a cylindrical shape, and any other suitable shape, such as a hollow square tube, an octagonal shape, or the like, may be utilized. Furthermore, the treatment chamber 703 may be surrounded by a housing 719 made of material that is inert to the various process materials. As such, while the housing 719 may be any suitable material that can withstand the chemistries and pressures involved in the deposition process, in an embodiment the housing 719 may be steel, stainless steel, nickel, aluminum, alloys of these, combinations of these, and like.

Within the treatment chamber 703 the contact 305 may be placed on a mounting platform 722 in order to position and control the contact 305 during the treatment process 701. The treatment chamber 703 may also have an exhaust outlet 725 for exhaust gases to exit the treatment chamber 703. A vacuum pump 724 may be connected to the exhaust outlet 725 of the treatment chamber 703 in order to help evacuate the exhaust gases. The vacuum pump 724, under control of the control unit 715, may also be utilized to reduce and control the pressure within the treatment chamber 703 to a desired pressure and may also be utilized to evacuate precursor materials from the treatment chamber 703.

In a specific embodiment, the treatment process 701 is initiated by putting the first treatment precursor into the first precursor delivery system 705 or having the first treatment precursor formed by the first precursor delivery system 705. In an embodiment the first treatment precursor may be a precursor which can reduce and remove the base layer 603, but which will also help to reduce and/or prevent the remaining material of the contact 305 (e.g., cobalt) from segregating and causing voids to occur along the surface of the contact 305. In a particular embodiment the first treatment precursor may be hydrogen ($H_2$), oxygen ($O_2$), argon (Ar), combinations of these, or the like. However, any suitable precursor may be utilized.

Additionally, in an embodiment in which the first treatment precursor is a gas, a diluent gas is utilized to help carry the first treatment precursor and also to help assist with the ignition of the plasma. In some embodiments the diluent gas may be a gas such as argon, nitrogen, helium, combinations of these, or the like. The diluent gas may be added either within the first precursor delivery system 705 itself, or else may be added separately and then combined with the first treatment precursor within the manifold 716 exiting the precursor gas controller 713. However, any suitable diluent gas and any suitable method of mixing may be utilized.

Once the first treatment precursor and the diluent gas have been placed into the first precursor delivery system 705, the treatment process 701 may be initiated by the control unit 715 sending an instruction to the precursor gas controller 713 to connect the first precursor delivery system 705 to the manifold 716. In an embodiment flow rates within the manifold 716 may be controlled such that the first treatment precursor (e.g., $H_2$) to diluent gas (e.g., argon) flow rate ratio is between about 1:1 and about 1:2. If the ratio of the diluent gas (e.g., argon) is above this amount, the ion dissociation of the first treatment precursor (e.g., hydrogen) is satiated and it would not participate in the reactions. Additionally, if the ratio of the diluent gas is below this range, the amount of the diluent gas is not sufficient to help the first treatment precursor dissociate.

Once the first treatment precursor is within the manifold 716, the first treatment precursor may enter the plasma block 720. In the plasma block 720 the first treatment precursor and the carrier gas will be converted into the first treatment plasma 721. Once converted, the first treatment plasma 721 is then sent into the treatment chamber 703.

During the treatment process 701, the ambient conditions may be kept at a pressure and temperature which helps to remove the base layer 603 while still reducing or preventing segregation of the material of the contact 305 (e.g., cobalt). For example, in some embodiments the ambient conditions within the treatment chamber 703 may have a pressure of between about 1 T and about 2 T, and the treatment chamber 703 may be kept at a temperature of between about 200° C. and about 300° C. Additionally, the treatment process 701 may be performed at a power of between about 1000 W and about 2000 W for a time of between about 90 seconds and about 180 seconds. However, any suitable conditions may be utilized.

Once in the treatment chamber 703, the first treatment plasma 721 will begin to react with the base layer 603 and start removing the base layer 603, with FIG. 7A showing a partial reaction wherein a part of the base layer 603 is reduced. However, by utilizing the processes discussed herein, the partial removal of the base layer 603 will not cause the underlying material of the contact 305 (e.g., cobalt) to segregate into different crystalline regions. By preventing or at least minimizing segregation of the material of the contact 305, a smoother and cleaner surface of the contact 305 may be achieved.

Figure 7D:
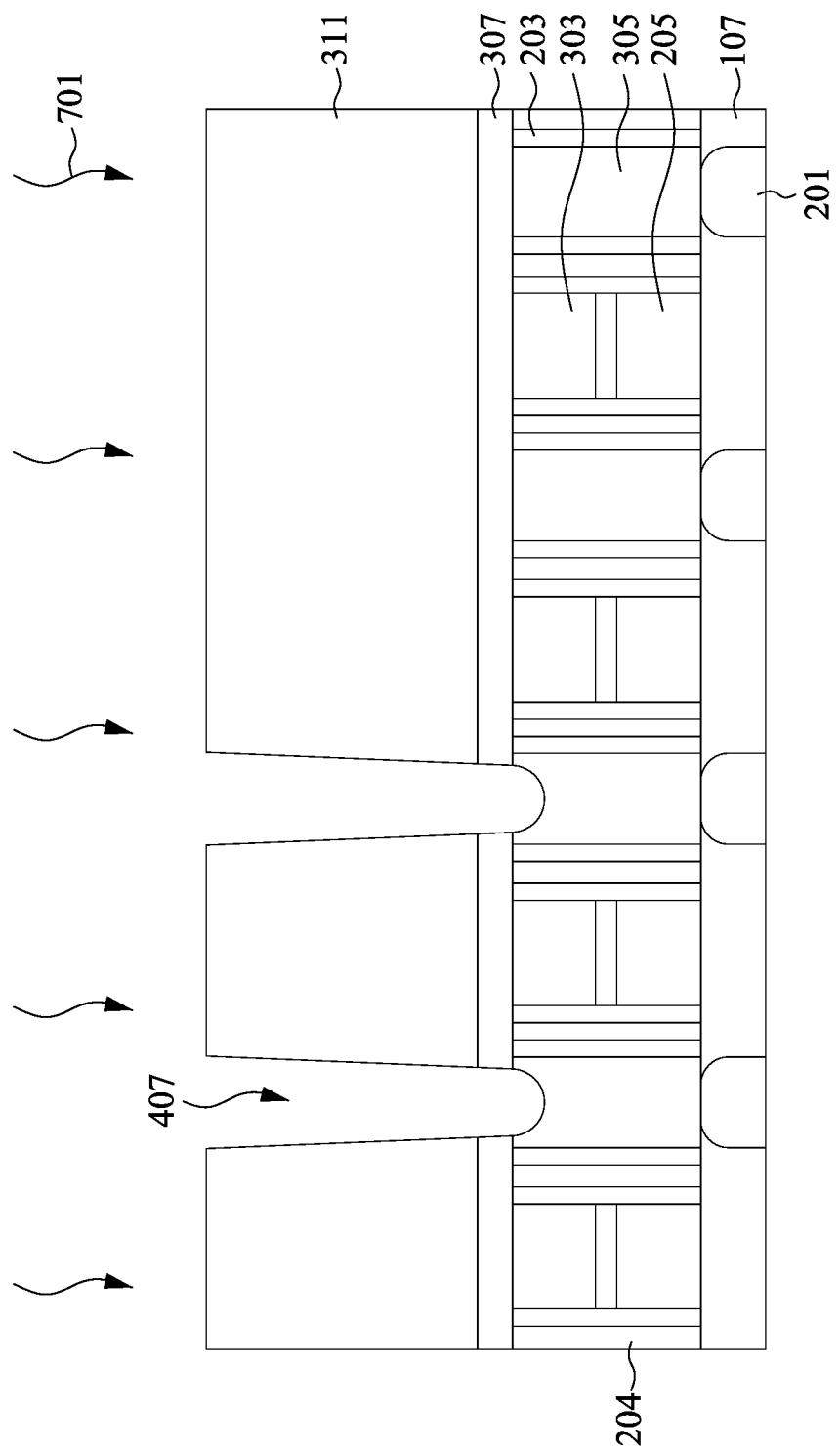

FIG. 7D illustrates that, while the first treatment 701 may be stopped at any suitable time (e.g., the first treatment 701 may be stopped after a portion, but not all, of the base layer 603 has been removed), in some embodiments the first treatment 701 may be continued until the base layer 603 has been completely removed. As such, the contact 305 is exposed without any portion of the base layer 603 being present.

Figure 7E:
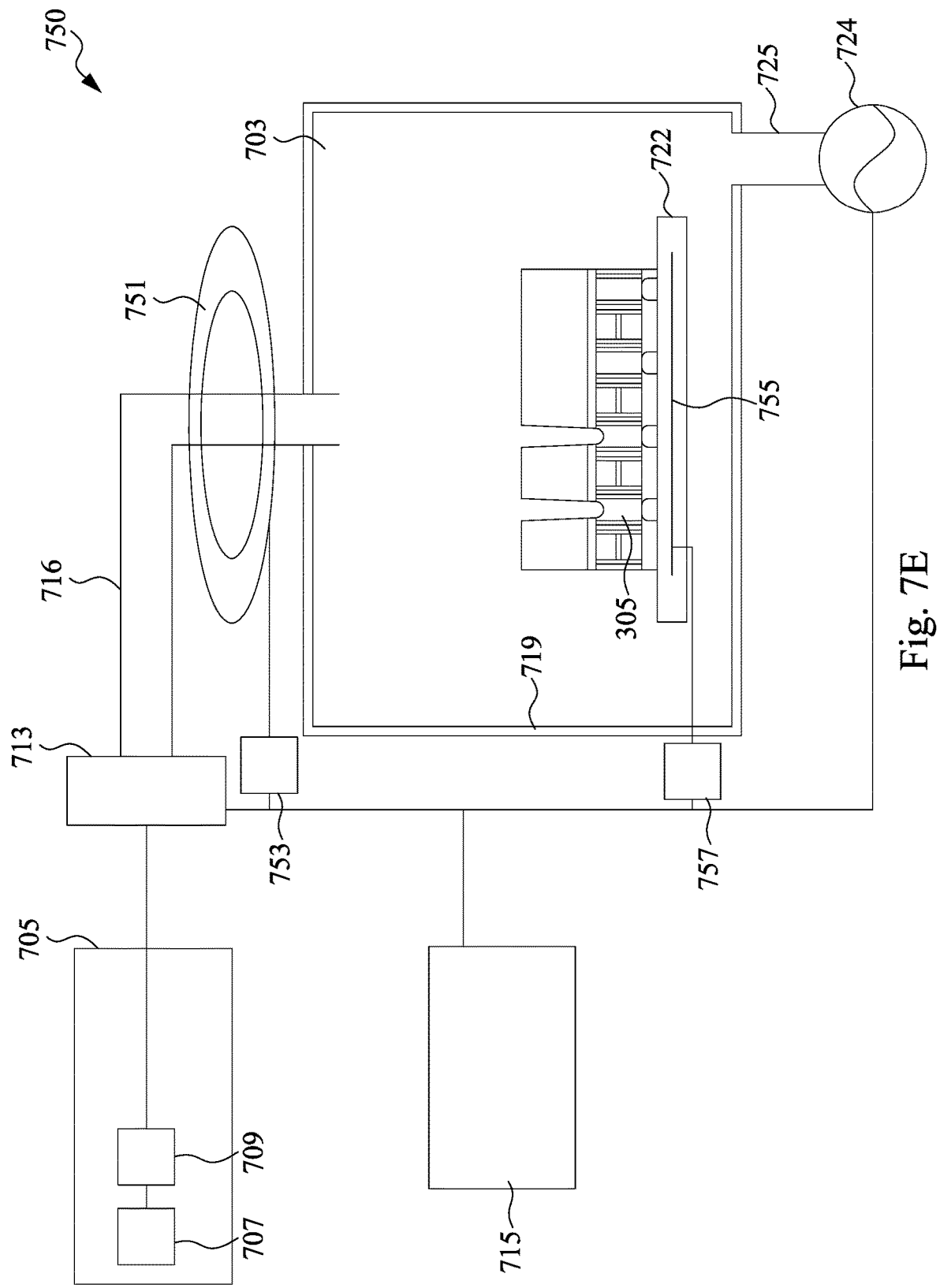

FIG. 7E illustrates that, optionally at this point, after the remote plasma treatment of the first treatment 701 has been performed, a second plasma treatment may be performed. In an embodiment the second plasma treatment may not be a remote plasma treatment, but instead the plasma may be generated directly over the structure, such as a charge coupled plasma generation. For example, and as illustrated in FIG. 7E the contact 305 may be placed in a second treatment system 750 for the second plasma treatment.

In an embodiment the second treatment system 750 may be a different system from the first treatment system 700, but may still have many similar components, such that, for clarity, similar components are labeled similarly as the components described above with respect to the first treatment system 700. In other embodiments, the second treatment system 750 may actually be the same physical structure as the first treatment system 700, wherein the first treatment system 700 comprises all of the equipment described as follows. In such an embodiment pieces of equipment that are not utilized as part of the second plasma treatment, such as the plasma block 720 are not illustrated in FIG. 7E because they are not in use, but may still be physically present.

In an embodiment, the second treatment system 750, in addition to the structures already described above, also comprises an upper electrode 751, for use as a plasma generator. In an embodiment the plasma generator may be a transformer coupled plasma generator and may be, e.g., a coil. The coil may be attached to a first RF generator 753 that is utilized to provide power to the upper electrode 751 (under control of the control unit 715) in order to ignite the plasma during introduction of, e.g., a second treatment precursor.

However, while the upper electrode 751 is described above as a transformer coupled plasma generator, embodiments are not intended to be limited to a transformer coupled plasma generator. Rather, any suitable method of generating the plasma, such as inductively coupled plasma systems, an electron cyclotron resonance, or the like, may also be utilized. All such methods are fully intended to be included within the scope of the embodiments.

Additionally in this embodiment, the mounting platform 722 may additionally comprise a second electrode 755 coupled to a second RF generator 757. The second electrode 755 may be electrically biased by the second RF generator 757 (under control of the control unit 715) at a RF voltage during the treatment process. By being electrically biased, the second electrode 755 is used to provide a bias to the incoming plasmas and assist to ignite them into a plasma. Additionally, the second electrode 755 is also utilized to maintain the plasma during the process by maintaining the bias.

To start the process, the first treatment precursor can again be placed in the first precursor delivery system 705. In an embodiment the first precursor delivery may be used by itself or else with the diluent gas as described above. Additionally, the contact 305 will be placed or else remain on the mounting platform 722, and the first treatment precursor is introduced to the treatment chamber 703 as a gas (not a plasma).

Once the first treatment precursor is present within the treatment chamber 703, the control unit 715 will perform an ignition step and ignite the first treatment precursor (or the combination of the first treatment precursor and diluent gas) into a plasma by setting the RF power at 60 MHz to between about 100 W and about 200 W at a pressure of between about 1 torr and about 5 torr and a temperature of between about 90° C. And about 180° C. The ignition step may be maintained for a time of between about 4 s and about 30 s in order to ensure ignition of the plasma.

Additionally, while some embodiments utilize a single ignition of the first treatment precursor, other embodiments may utilize a number of cycles where the first treatment precursor is ignited. For example, the first treatment precursor may be ignited a first time and then allowed to return to a non-plasma state before being ignited again. This cycle may be repeated as many times as desired, such as three or more times, such as six cycles.

By utilizing the optional direct bombardment process, a combined process can be achieved in order to achieve the benefits of the direct bombardment process (e.g., helping to ensure complete removal of the base layer 603 at the end of the process), while also minimizing the amount of time that the direct bombardment process is used. With less time being used, less damage will also occur, thereby limiting the amount of defects that are present in the final structure.

Figure 8:
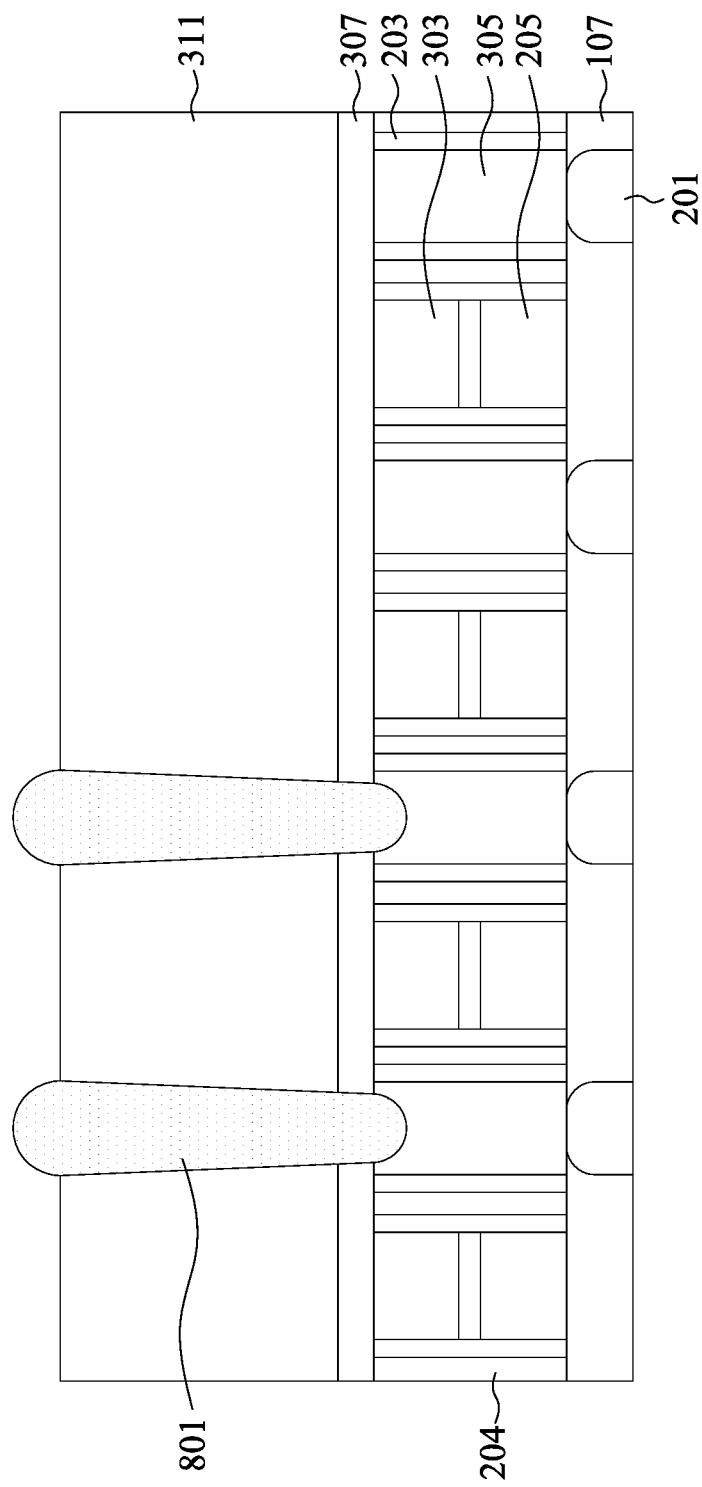
FIG. 8 illustrates formation of a conductive contact, in accordance with some embodiments.

FIG. 8 illustrates a formation of conductive contacts 801 (on either embodiment in which the base layer 603 is fully removed or not). The conductive contacts 801 may comprise a conductive material such as W, Al, Cu, Ti, TiAlN, TaC, TaCN, TaSiN, Mn, Zr, TiN, Ta, TaN, Co, Ni, combinations of these, or the like. In some embodiments, the conductive contacts 801 comprise tungsten. The conductive contacts 801 may be formed by any suitable method, such as e.g. CVD, plasma-enhanced CVD (PECVD), MOCVD, thermal CVD, PVD, ALD, or the like. In some embodiments, a bottom-up deposition process is performed using a thermal CVD process. The bottom-up deposition process may be performed using $WF_6$ and $H_2$ as process gases (when tungsten is to be grown). However, any suitable materials and processes may be utilized.

The vertical growth of the conductive contacts 801 may be controlled to produce heights of the conductive contacts 801 in a range of 48 nm to 67 nm, which may be advantageous for producing conductive contacts 801 with a desired height compatible with subsequent planarizations. Conductive contacts 801 with heights less than 48 nm may be shorter than a subsequent planarization, which may lead to a subsequently deposited dielectric layer covering top surfaces of the conductive contacts 801 and decreasing performance. Conductive contacts 801 with heights greater than 67 nm may lead to overgrowth on the top surface of the IMD layer, layer 143, which may lead to overburdening of a subsequent planarization.

In some embodiments, a germanium implantation process or germanium ion bombardment is performed on top surfaces of the conductive contacts 801 in order to help strengthen an interface between the conductive contacts 801 and the surrounding layers. By strengthening the interface, the amount of CMP slurry that is subsequently applied during planarization processes (described further below) and that seeps down through cracks may be reduced.

Once the germanium implantation process has been performed, sacrificial or buffer layers (not separately illustrated) may be formed over the conductive contacts 801 prior to a planarization process such as a CMP. In particular, because the formation processes may cause some top surfaces of the conductive contacts 801 to be concave and other top surfaces of the conductive contacts 801 to be convex, the subsequent CMP may trigger underpolishment or overpolishment defects. As such, the sacrificial layers may be formed on the conductive contacts 801 in order to reduce underpolishment or overpolishment defects by overburdening the conductive contacts 801 and as a stop line in CMP processing. In some embodiments, the sacrificial layers comprise one or more layers of Ti, TiN, and tungsten. The sacrificial layers of Ti and TiN may be formed using methods such as CVD, PVD, ALD, combinations of these, or the like. The sacrificial layer of tungsten may be formed using similar methods and materials as the conductive contacts 801. However, any suitable methods or materials may be used.

Figure 9:
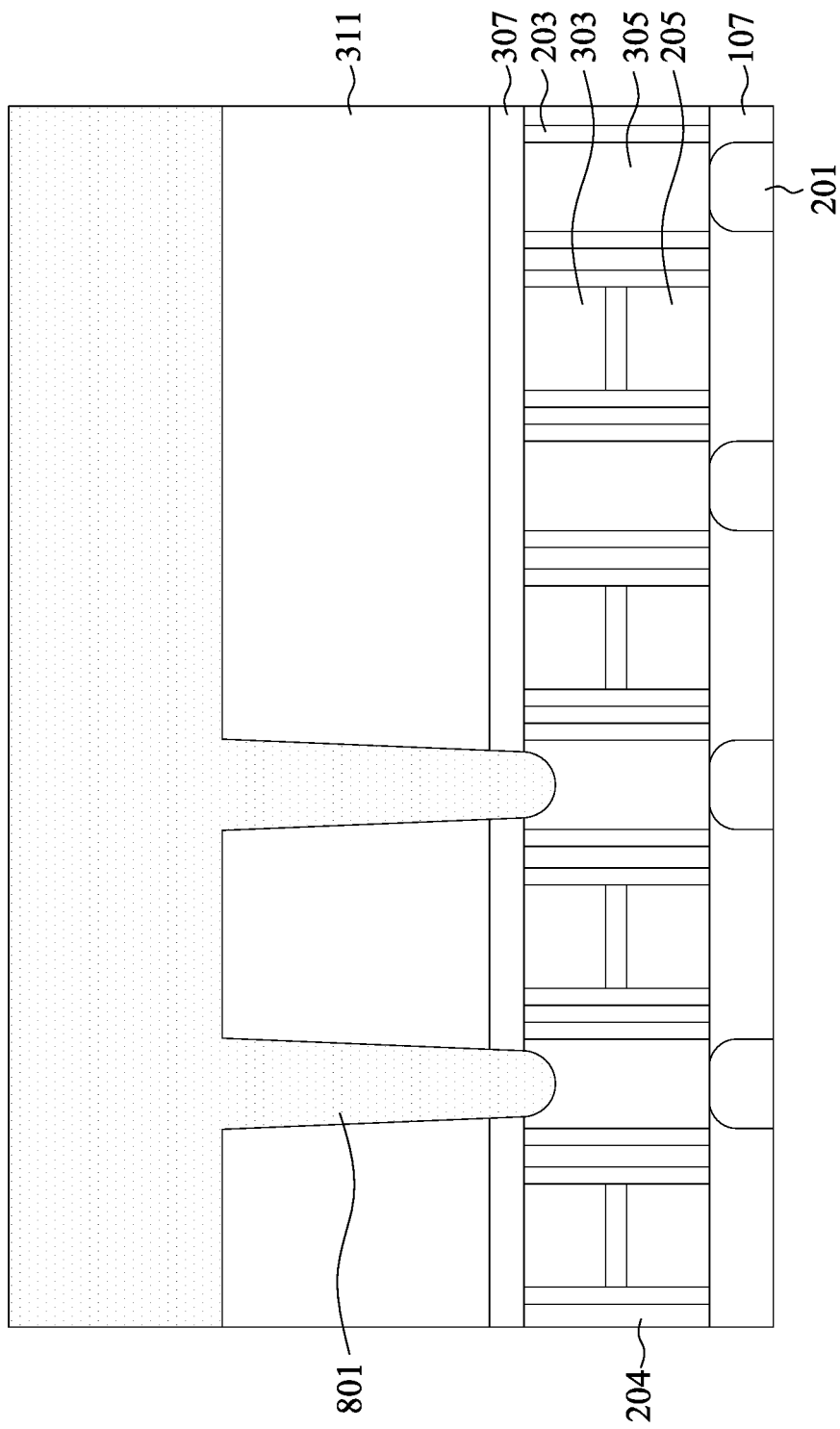
FIG. 9 illustrates part of a formation of additional vias, in accordance with some embodiments.

FIG. 9 illustrates that, at this point, optional additional vias (only the top of which are illustrated in FIG. 9) through the second ILD layer 311 may be formed. In an embodiment the vias may be formed as described above with respect to the conductive contacts 801, such as by forming an opening into or through the second ILD layer and then filling and overfilling the opening with a conductive material (the overfilled portion of which is illustrated as overlying the conductive contacts 801). However, any suitable method of forming the additional vias may be utilized, and all such methods and materials are fully intended to be included within the scope of the embodiments.

Figure 10:
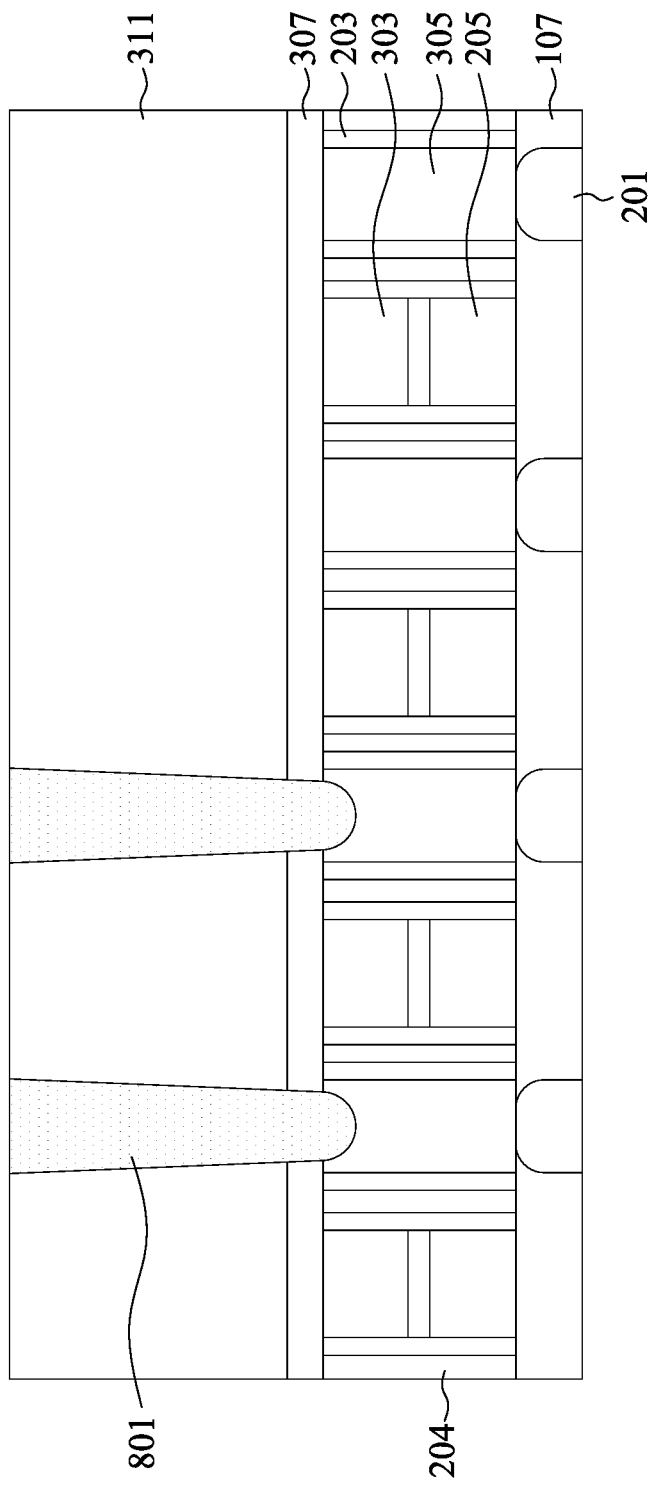
FIG. 10 illustrates a planarization process, in accordance with some embodiments.

FIG. 10 illustrates that, once the material of the additional vias has been formed to fill and/or overfill the openings through the second ILD layer 311, any deposited material outside of the openings through the second ILD layer 311 may be removed using a planarization process such as chemical mechanical polishing (CMP). However, any suitable material and process of formation may be utilized. As such, the conductive contacts 801 and additional vias (which are not visible in the particular view illustrated in FIG. 10) are planarized to be coplanar with the material of the second ILD layer 311.

Figure 11:
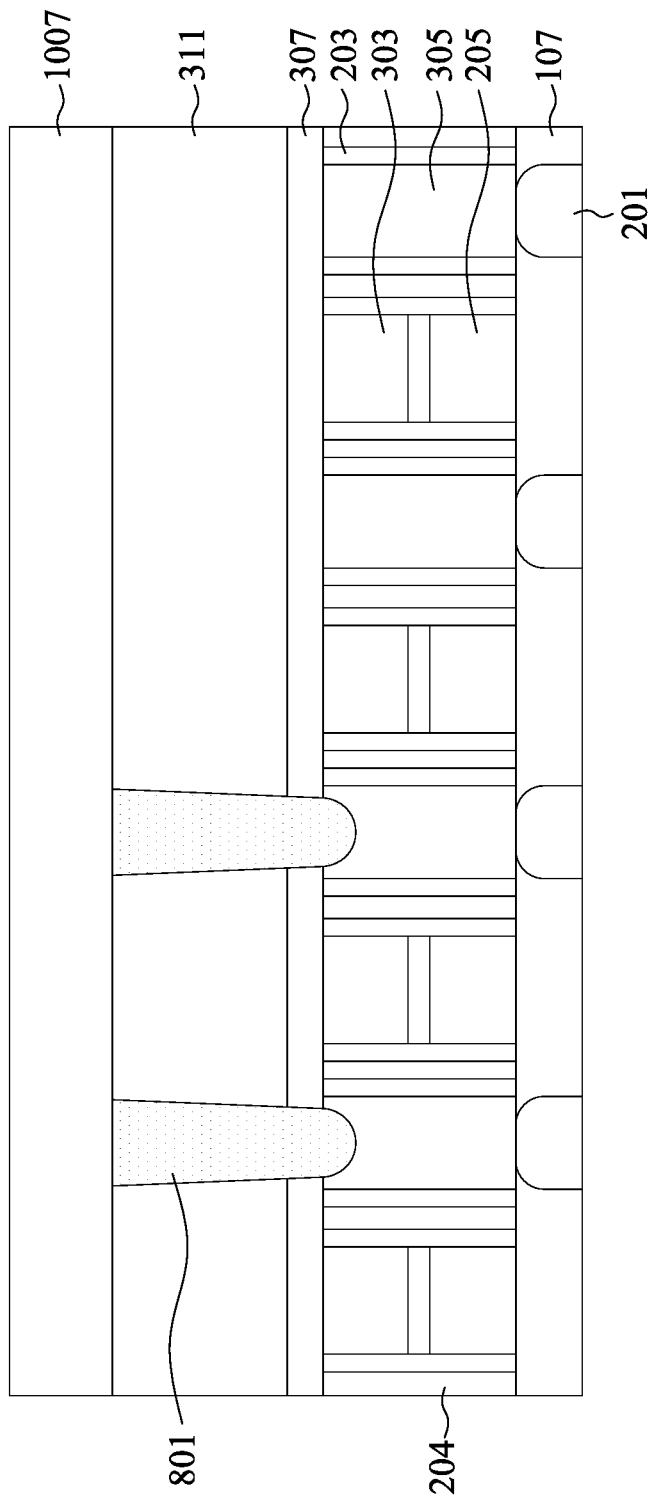
FIG. 11 illustrates a recapping process, in accordance with some embodiments.

FIG. 11 illustrates that, in some embodiments the planarization process or a separate planarization process may be further used in order to reduce the height of the second ILD layer 311 and remove any chapping profiles or other defects. In some embodiments the height of the second ILD layer 311 may be reduced by a distance of about 52 nm, such that the second ILD layer 311 may have an end height of between about 10 nm and about 25 nm, such as about 18 nm. However, any suitable height may be utilized.

FIG. 11 also illustrates a formation of an IMD layer 1007 formed over the conductive contacts 801 to replace height lost by the second ILD layer 311 in the previous planarization process. The IMD layer 1007 may be formed using similar processes and materials as the second ILD layer 311 as described above with respect to FIG. 3. However, any suitable processes or materials may be used.

Once the IMD layer 1007 has been formed, additional processing steps may be utilized in order to further completion of the overall semiconductor device. For example, additional metallization layers may be manufactured, one or more passivation layers may be deposited and patterned, and external connections may be placed in order to provide a pathway for power, ground, and signal connections to, from, and between the active devices and other devices within the semiconductor device. However, any other suitable steps and/or methods may be utilized to help manufacture the semiconductor device.

However, by utilizing a remote plasma to help remove the base layer 607 from the contact 305, the removal process will have a reduced amount of physical bombardment during the reduction and removal of the base layer 607. As such, there will be less physical damage that increases the amount of surface roughness of the underlying material of the contact 305, and an overall reduction in the amount of segregation of the materials is achieved. The reduction in segregation also causes a reduction in voids that occur along the surface of the contact 305. With fewer voids being formed, there is less intermixing between the top surface of the contact 305 and the bottom surface of the overlying conductive contact 801 and a cleaner interface between the contact 305 and the conductive contact 801 may be achieved, thereby reducing loss of the material of the conductive contact 801 (e.g., reduction of tungsten loss) and increasing the overall yield.

In accordance with an embodiment, a method of manufacturing a semiconductor device includes: forming a contact to a source/drain region, the contact being adjacent to a semiconductor fin; depositing a dielectric layer over the contact; exposing the contact through the dielectric layer; placing the contact into a treatment chamber; generating a plasma outside of the treatment chamber; introducing the plasma to the treatment chamber; and depositing a conductive material in physical contact with the contact. In an embodiment the generating the plasma uses an inductively coupled plasma. In an embodiment the generating the plasma uses hydrogen as a precursor. In an embodiment the treatment chamber is kept at a pressure of between about 1 Torr and about 2 Torr during the introducing the plasma. In an embodiment the treatment chamber is kept at a temperature of about 200° C. during the introducing the plasma. In an embodiment the contact comprises cobalt. In an embodiment the introducing the plasma causes the cobalt to segregate no more than 50%.

In accordance with another embodiment, a method of manufacturing a semiconductor device includes: forming an opening through a dielectric layer to expose a source/drain contact; oxidizing a portion of the source/drain contact to form a base layer; removing the base layer with a remote plasma process, the remote plasma process utilizing an inductively coupled hydrogen plasma; and depositing a conductive material onto the source/drain contact. In an embodiment the remote plasma process also utilizes an argon plasma. In an embodiment the removing the base layer is performed at a pressure of between about 1 Torr and about 2 Torr. In an embodiment the removing the base layer is performed at a temperature of about 200° C. In an embodiment the source/drain contact comprises cobalt. In an embodiment the conductive material comprises tungsten. In an embodiment the method further includes implanting germanium into the conductive material.

In accordance with yet another embodiment, a method of manufacturing a semiconductor device includes: recessing a source/drain contact through an opening in a dielectric layer; oxidizing a top surface of the source/drain contact through the opening to form a base layer; removing the base layer with a hydrogen plasma and an argon plasma, wherein the hydrogen plasma and argon plasma are generated in a remote plasma unit; and depositing a conductive material into the opening. In an embodiment the source/drain contact comprises cobalt. In an embodiment the depositing the conductive material deposits tungsten. In an embodiment the method further includes implanting germanium into the conductive material. In an embodiment the method further includes planarizing the conductive material. In an embodiment the method further includes, after the removing the base layer with the hydrogen plasma and the argon plasma, exposing the source/drain contact to a second plasma generated using a charge coupled plasma generation process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a contact to a source/drain region, the contact being adjacent to a semiconductor fin, wherein the contact comprises cobalt;
    depositing a dielectric layer over the contact;
    exposing the contact through the dielectric layer;
    placing the contact into a treatment chamber;
    generating a plasma outside of the treatment chamber;
    introducing the plasma to the treatment chamber, wherein the introducing the plasma causes the cobalt to segregate no more than 50%; and
    depositing a conductive material in physical contact with the contact.

2. The method of claim 1, wherein the generating the plasma uses an inductively coupled plasma.

3. The method of claim 1, wherein the generating the plasma uses hydrogen as a precursor.

4. The method of claim 1, wherein the treatment chamber is kept at a pressure of between about 1 Torr and about 2 Torr during the introducing the plasma.

5. The method of claim 4, wherein the treatment chamber is kept at a temperature of about 200° C. during the introducing the plasma.

6. The method of claim 1, wherein the treatment chamber is kept at a temperature of between about 200° C. and about 300° C. during the introducing the plasma.

7. A method of manufacturing a semiconductor device, the method comprising:
    forming a contact to a source/drain region, the contact being adjacent to a semiconductor fin, wherein the contact comprises cobalt;
    depositing a dielectric layer over the contact;
    exposing the contact through the dielectric layer;
    forming an oxide base layer within a recess of the contact;
    placing the contact into a treatment chamber;
    generating a plasma outside of the treatment chamber;
    removing the oxide base layer with the plasma, wherein the removing the oxide base layer with the plasma causes the cobalt to segregate no more than 50%; and
    depositing a conductive material in physical contact with the contact.

8. The method of claim 7, wherein the generating the plasma uses an inductively coupled plasma.

9. The method of claim 7, wherein the generating the plasma uses hydrogen as a precursor.

10. The method of claim 7, wherein the treatment chamber is kept at a pressure of between about 1 Torr and about 2 Torr during the removing the oxide base layer with the plasma.

11. The method of claim 10, wherein the treatment chamber is kept at a temperature of about 200° C. during the removing the oxide base layer with the plasma.

12. The method of claim 7, wherein the forming the oxide base layer comprises at least in part an ion bombardment.

13. The method of claim 12, wherein the forming the oxide base layer comprises at least in part an ashing process in an ambient air environment.

14. A method of manufacturing a semiconductor device, the method comprising:
    forming a contact to a source/drain region, the contact being adjacent to a semiconductor fin;
    depositing a dielectric layer over the contact;
    exposing the contact through the dielectric layer;
    placing the contact into a treatment chamber;
    generating a plasma outside of the treatment chamber;
    introducing the plasma to the treatment chamber, wherein the introducing the plasma causes the contact to segregate no more than 50%; and
    depositing a conductive material in physical contact with the contact.

15. The method of claim 14, wherein the generating the plasma uses an inductively coupled plasma.

16. The method of claim 14, wherein the generating the plasma uses hydrogen as a precursor.

17. The method of claim 14, wherein the treatment chamber is kept at a pressure of between about 1 Torr and about 2 Torr during the introducing the plasma.

18. The method of claim 17, wherein the treatment chamber is kept at a temperature of about 200° C. during the introducing the plasma.

19. The method of claim 14, wherein the contact comprises cobalt.

20. The method of claim 14, wherein the introducing the plasma to the treatment chamber is performed for a time of between about 90 seconds and about 180 seconds.

* * * * *